(12) United States Patent
Shimizu

(10) Patent No.: US 9,945,028 B2
(45) Date of Patent: Apr. 17, 2018

(54) METHOD OF FILLING RECESS

(71) Applicant: TOKYO ELECTRON LIMITED, Tokyo (JP)

(72) Inventor: Akira Shimizu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/581,475

(22) Filed: Apr. 28, 2017

(65) Prior Publication Data

US 2017/0314123 A1    Nov. 2, 2017

(30) Foreign Application Priority Data

May 2, 2016    (JP) ................................ 2016-092452

(51) Int. Cl.
  *C23C 16/00*    (2006.01)
  *C23C 16/34*    (2006.01)
  *C23C 16/455*   (2006.01)

(52) U.S. Cl.
  CPC ...... *C23C 16/345* (2013.01); *C23C 16/45527* (2013.01)

(58) Field of Classification Search
  CPC .................. C23C 16/345; C23C 16/45527
  See application file for complete search history.

(56) References Cited

U.S. PATENT DOCUMENTS

| 5,516,721 A * | 5/1996 | Galli ................. H01L 21/76224 257/510 |
| 6,888,212 B2 * | 5/2005 | Iyer ................... H01L 21/76224 257/506 |
| 7,863,190 B1 * | 1/2011 | Papasouliotis ........ C23C 14/046 257/E21.553 |

FOREIGN PATENT DOCUMENTS

JP    2006-351689 A    12/2006

* cited by examiner

*Primary Examiner* — Kelly M Gambetta
(74) *Attorney, Agent, or Firm* — Nath, Goldberg & Meyer; Jerald L. Meyer

(57) ABSTRACT

A method of filling a recess with a nitride film is performed by repeating a cycle. The cycle includes a film-forming raw material gas adsorption process of adsorbing a raw material gas containing an element forming the nitride film to be formed on a target substrate on which the recess is formed on its surface, and a nitriding process of nitriding the adsorbed raw material gas by nitriding species to fill the recess. At least a portion of a period for forming the nitride film is used as a bottom-up growth period, for which a polymer material adsorbable to the surface of the target substrate is supplied in a gaseous state and is adsorbed to an upper portion of the recess to inhibit adsorption of the film-forming raw material gas, and for which the nitride film is grown from a bottom portion of the recess.

11 Claims, 7 Drawing Sheets

METHOD OF FILLING RECESS

CROSS-REFERENCE TO RELATED APPLICATION

This application claims the benefit of Japanese Patent Application No. 2016-092452, filed on May 2, 2016, in the Japan Patent Office, the disclosure of which is incorporated herein in its entirety by reference.

TECHNICAL FIELD

The present disclosure relates to a method of filling a nitride film in a recess.

BACKGROUND

In a sequence of manufacturing a semiconductor device, a film forming process of forming a nitride film such as a silicon nitride film (SiN film) or the like as an insulating film on a semiconductor wafer represented by a silicon wafer is performed. In this film forming process of the SiN film, a chemical vapor deposition (CVD) method is used.

When an SiN film (CVD-SiN) is embedded in a trench by the CVD method, voids or seams may be generated. In this case, a method of forming an SiN film by the CVD method is performed again after performing an etch back to a place where the voids or seams are generated is employed.

Recently, however, as devices have been reduced in size, step coverage is not sufficient for CVD-SiN, making it difficult to suppress generation of voids or seams even by the aforementioned method.

An atomic layer deposition (ALD) method has been known as a technique that allows film formation with step coverage better than that of the CVD method, and the ALD method is also used to embed an SiN film in a fine trench.

However, due to further reduction of devices in size, it is difficult to embed an SiN film, while preventing generation of voids or seams, even by the ALD method.

SUMMARY

Some embodiments of the present disclosure provide a method of filling a recess, which is capable of embedding a nitride film without generation of voids or seams in a fine recess.

According to one embodiment of the present disclosure, there is provided a method of filling a recess by forming a nitride film in the recess by repeating a cycle, the cycle including: a film-forming raw material gas adsorption process of adsorbing a film-forming raw material gas containing an element forming the nitride film to be formed on a target substrate on which the recess is formed on a surface of the target substrate; and a nitriding process of nitriding the adsorbed film-forming raw material gas by nitriding species generated by activating a nitriding gas to fill the recess, wherein at least a portion of a period for forming the nitride film is used as a bottom-up growth period, for which a polymer material adsorbable to the surface of the target substrate is supplied in a gaseous state and is adsorbed to an upper portion of the recess to inhibit adsorption of the film-forming raw material gas, and for which the nitride film is grown from a bottom portion of the recess.

According to one embodiment of the present disclosure, there is provided a method of filling a recess by forming a nitride film in the recess formed on a surface of a target substrate, the method including: a first process of forming a conformal nitride film in the recess by repeating a film-forming raw material gas adsorption process of adsorbing a film-forming raw material gas containing an element forming the nitride film to be formed, and a nitriding process of nitriding the adsorbed film-forming raw material gas by nitriding species generated by activating a nitriding gas; and a second process of inhibiting adsorption of the film-forming raw material gas and growing the nitride film from a bottom portion of the recess by repeating the film-forming raw material gas adsorption process, the nitriding process, and a polymer material adsorption process of supplying a polymer material adsorbable to the surface of the target substrate in a gaseous state to allow the polymer material to be adsorbed to an upper portion of the recess in this order.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
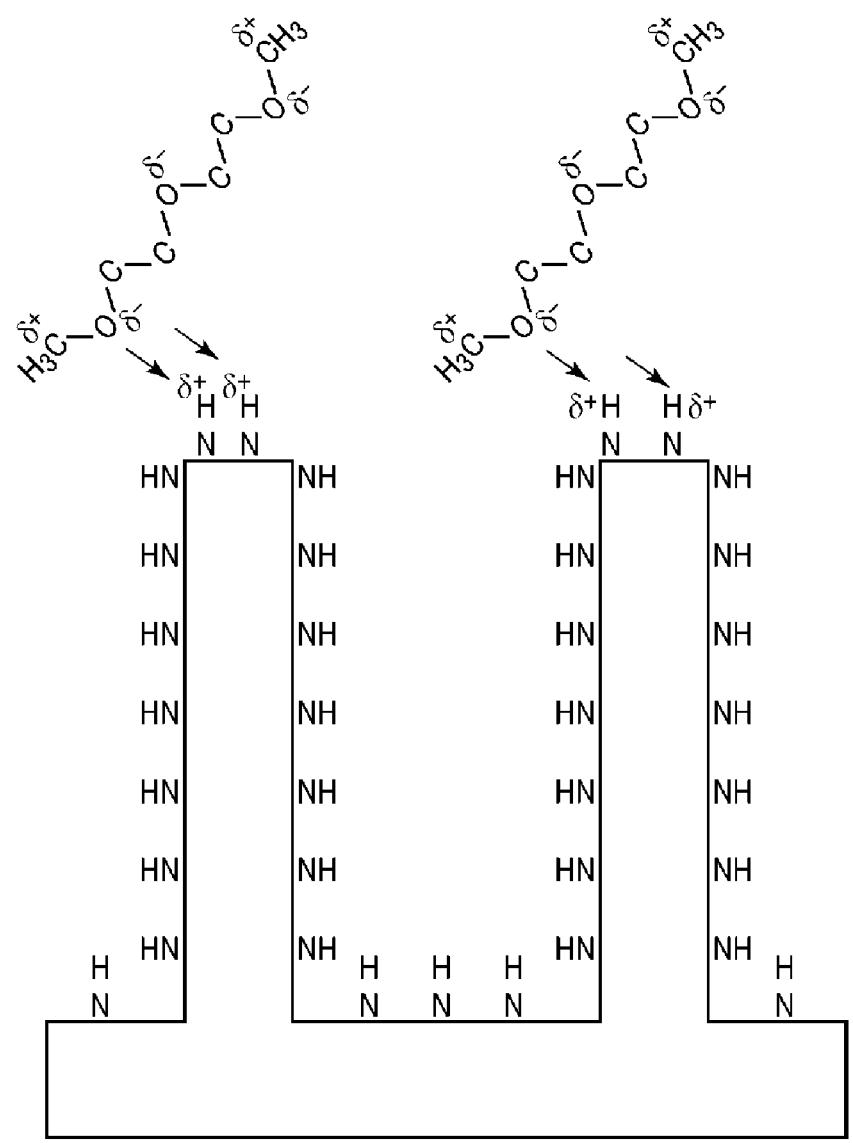
FIG. 1 is a diagram schematically illustrating a state in which diglyme is used as a polymer material adsorbable to an NH group.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In the present disclosure, a nitride film is embedded in a recess of a target substrate by an ALD method. In the present embodiment, a silicon nitride film (SiN film) will be described as an example of a nitride film.

<Summary of Method of Filling Recess in the Present Embodiment>

In the present embodiment, an SiN film is embedded in a recess such as a trench, a hole or the like formed on a target substrate by an ALD method.

In the case of forming an SiN film by the ALD method, dichlorosilane (DCS; $SiH_2Cl_2$) or the like is generally used as a film-forming raw material gas (Si precursor), and, in performing nitriding, a sequence of adsorbing an Si precursor→nitriding by nitriding species→adsorbing an Si precursor→ . . . is repeated using nitriding species generated by activating a nitriding gas such as an $NH_3$ gas by plasma or the like. At this time, since an NH group is bonded to a dangling bond of a surface due to adsorption of the Si precursor and nitriding by the nitriding species, the Si precursor is chemically adsorbed using ligand-exchange between H of the NH group present on the surface and Cl.

At this time, in film formation by the normal ALD method, a film is conformally grown, causing seams or voids to be generated in the SiN film embedded in a recess. In order to suppress such seams or voids, it is effective to inhibit adsorption of the Si precursor in an upper portion of the recess and promote only adsorption of the Si precursor in a lower portion of the recess.

Thus, in the present embodiment, only the adsorption of the Si precursor in the upper portion of the recess formed in the target substrate is inhibited by a polymer material adsorbable to the group present on the surface, i.e., an NH group. That is, when the polymer material is adsorbed to the NH group present on the surface, adsorption of an Si precursor to be subsequently supplied is inhibited in the adsorbed portion. Meanwhile, since the polymer material is polymer, it is difficult to reach the lower portion of the recess and it is difficult to exhibit the effect of inhibiting adsorption of the Si precursor in the lower portion, so that the effect of inhibiting adsorption of the Si precursor is exhibited only in the upper portion of the recess.

Thus, when the SiN film is formed by repeating the sequence of adsorbing an Si precursor→nitriding by nitriding species→adsorbing an Si precursor→ . . . , the polymer material as described above is supplied in a gaseous state to inhibit adsorption of the Si precursor to the upper portion of the recess and cause the Si precursor to be selectively adsorbed to the lower portion of the recess, thus growing SiN from the lower portion. Further, the supply of the polymer material is stopped when the film formation has progressed to some extent. In this manner, the entire interior of the recess is filled with the SiN film. Thus, it is possible to prevent the opening of the fine recess from being closed and to embed the SiN film without forming seams or voids therein.

As the polymer material adsorbable to the NH group, a polymer material having an ether bond may be considered. Due to a hydrogen bond occurring between oxygen included in the polymer material having an ether bond and the NH group of the surface of the target substrate, the polymer material is adsorbed to the target substrate.

As the polymer material having an ether bond, it may be possible to appropriately use glyme (1,2 dimethoxyethane ($C_4H_{10}O_2$)) expressed by Formula (1) below, diglyme (diethyleneglycoldimethylether ($C_6H_{14}O_3$)) expressed by Formula (2) below, and triglyme (triethyleneglycoldimethylether ($C_8H_{18}O_4$)) expressed by Formula (3) below. Among them, diglyme having a relatively large molecular weight, having a molecular size of about 1.2 nm calculated from an ionic radius and a bond angle of C-O-C, and having an appropriate vapor pressure is particularly preferable.

[Chemical Formula 1]

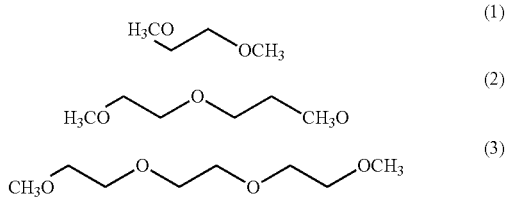

FIG. 1 schematically illustrates a state in which diglyme is used as a polymer material adsorbable to an NH group. As illustrated in FIG. 1, in a state in which an NH group is bonded to a dangling bond of a surface of a target substrate having a recess, diglyme is supplied in a gaseous state so that oxygen of diglyme having a weak negative ($\delta^-$) and hydrogen of the NH group having a weak positive ($\delta^-$) are hydrogen-bonded. Accordingly, diglyme molecules are adsorbed to a portion of the NH group in the upper portion of the recess. Thus, adsorption of the Si precursor in the upper portion of the recess is inhibited. Meanwhile, since the diglyme has large molecules, the supply of diglyme to the lower portion is hampered in the fine recess (e.g., a trench having a width of 10 nm or a hole having a diameter of 10 nm), so that inhibition of absorption of the Si precursor is difficult to occur in the lower portion.

A supply timing of the polymer material adsorbable to the NH group of the diglyme or the like is not particularly limited, but it is desirable that, from the viewpoint of inhibiting adsorption of the Si precursor to the upper portion of the recess and forming the SiN film from the lower portion of the recess, the polymer material be supplied before the Si precursor is supplied after nitriding. Specifically, after the Si precursor is supplied, nitriding is performed to allow the NH group to be bonded to the dangling bond of the surface, and thereafter, the polymer material is supplied, the Si precursor is supplied, and nitriding is performed. That is, it is desirable that the sequence of adsorbing an Si precursor→nitriding→adsorbing a polymer material→adsorbing an Si precursor→nitriding→adsorbing a polymer material→adsorbing an Si precursor→ . . . be repeated.

Figure 2A:
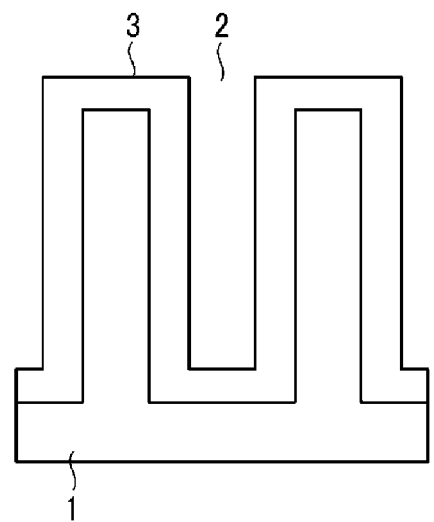
FIGS. 2A to 2C are diagrams illustrating a case where an SiN film is formed by a method of using a polymer material after a conformal SiN film is formed in order to fill a recess.
Figure 2B:
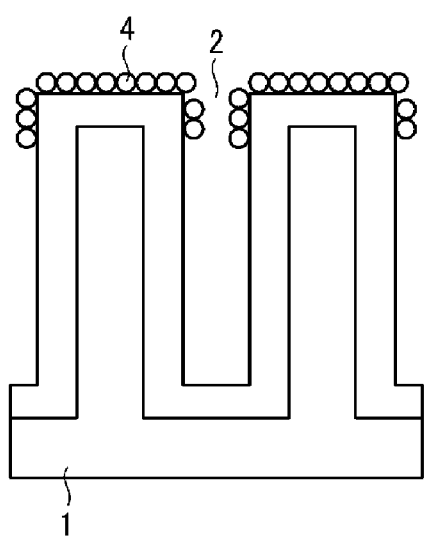
Figure 2C:
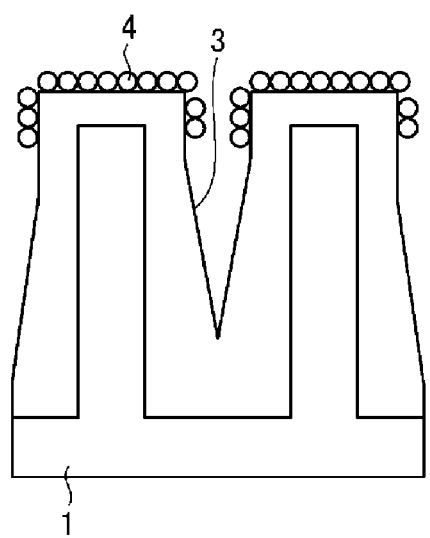

Further, in order to more reliably suppress arrival of the polymer material such as diglyme or the like at the lower portion of the recess, it is desirable that the recess be formed to have a narrower width and then the polymer material be subsequently supplied. To this end, as illustrated in FIG. 2A, initially, an SiN film 3 is conformally formed on a target substrate 1 having a recess 2 formed therein without using a polymer material so that the opening of the recess 2 is narrowed. Thereafter, as illustrated in FIG. 2B, a film is formed in a state in which a polymer material 4 such as diglyme or the like has been adsorbed to the upper portion of the recess 2. Accordingly, arrival of the polymer material at the lower portion of the polymer material is reliably suppressed and the SiN film 3 can be grown from the lower portion in a V shape as illustrated in FIG. 2C.

<Specific Example of Method of Filling Recess of the Present Embodiment>

Hereinafter, a specific example of the method of filling a recess of the present embodiment will be described with reference to sectional views of the processes of FIGS. 3A to 3D.

Initially, a semiconductor wafer (hereinafter, simply referred to as a "wafer") W having an insulating film 11, a fine trench 12 as a fine recess formed on the insulating film 11, and a liner film 13 formed on an inner wall of the fine trench 12 is prepared (FIG. 3A) to start formation of an SiN film.

Figure 3A:
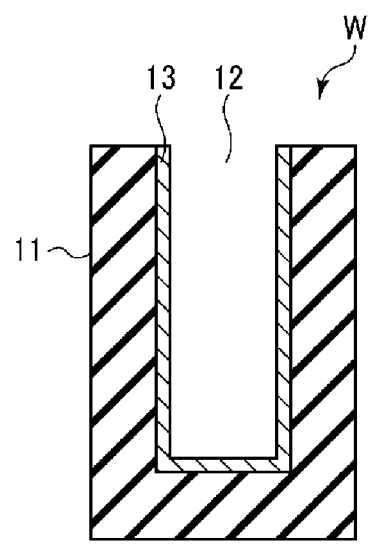
FIGS. 3A to 3D are sectional views illustrating a method of filling a recess according to one embodiment of the present disclosure.
Figure 3B:
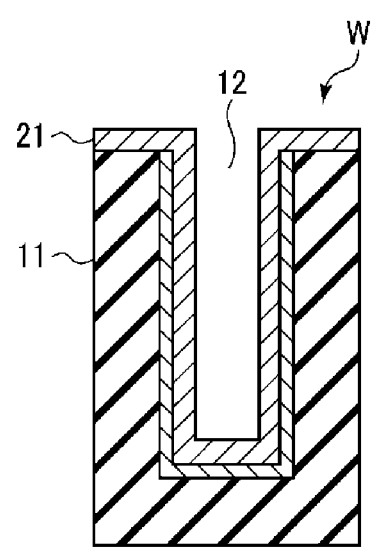

At an initial stage of film formation, since the opening of the fine trench 12 is not narrow, a conformal SiN film is formed at a first step before embedding using a polymer material, thus forming a conformal SiN film 21 as an initial embedded layer as illustrated in FIG. 3B.

The conformal SiN film 21 is formed by alternately repeating a process of supplying an Si precursor to allow the Si precursor to be adsorbed and performing nitriding by nitriding species as mentioned above. It is desirable that the temperature at that time be set to fall within a range of 150 to 600 degrees C. and that the pressure be set to fall within a range of 13 to 665 Pa.

As the Si precursor, it is desirable to contain Cl and it may be possible to suitably use dichlorosilane (DCS; $SiH_2Cl_2$). In addition to the DCS, it may be possible to use monochlorosilane (MCS; $SiH_3Cl$), trichlorosilane (TCS; $SiHCl_3$), silicontetrachloride (STC; $SiCl_4$), hexachlorodisilane (HCD; $Si_2Cl_6$) or the like.

In addition, as a nitriding gas at the time of nitriding, it may be possible to suitably use an $NH_3$ gas. An $H_2$ gas may be added to the $NH_3$ gas. Further, an $N_2$ gas and an $H_2$ gas may be used. An inert gas such as an Ar gas may also be added. In either case, these gases are activated by a plasma generating means or the like. Accordingly, nitriding species are generated. The plasma generating means at that time is not particularly limited. Further, the plasma generating means is not limited but may be an activating means as long as it can generate nitriding species applicable to nitriding.

Between adsorption of the Si precursor and nitriding, a residual gas removal process such as purging or the like by an inert gas is performed.

Figure 3C:
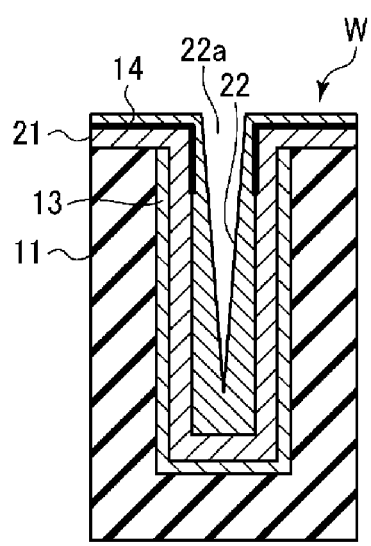

When the conformal SiN film 21 has a thickness to some extent and the opening of the fine trench 12 is narrowed, for example, when the opening falls within a range of 2 to 8 nm, the process goes to a second step of embedding by the embedding method of the present embodiment to form a V-shaped bottom-up SiN film 22 as illustrated in FIG. 3C as an embedded layer of the second step on the conformal SiN film 21.

Figure 4:
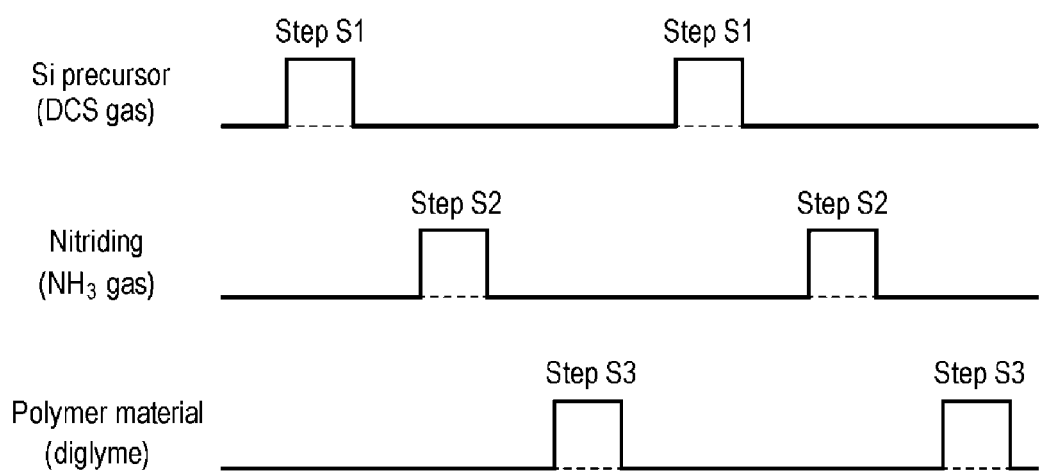
FIG. 4 is a diagram illustrating a sequence of a second step of embedding using a polymer material in the method of filling a recess according to one embodiment of the present disclosure.

In the second step of embedding, as illustrated in FIG. 4, a process of supplying the Si precursor (e.g., DCS) to allow the same to be adsorbed (step S1), a process of performing nitriding by nitriding species using a nitriding gas (e.g., $NH_3$) (step 2), and a process of supplying a polymer material (e.g., diglyme) adsorbable to an NH group to allow the same to be adsorbed (step 3) are sequentially repeated a plurality of times.

Figure 5:
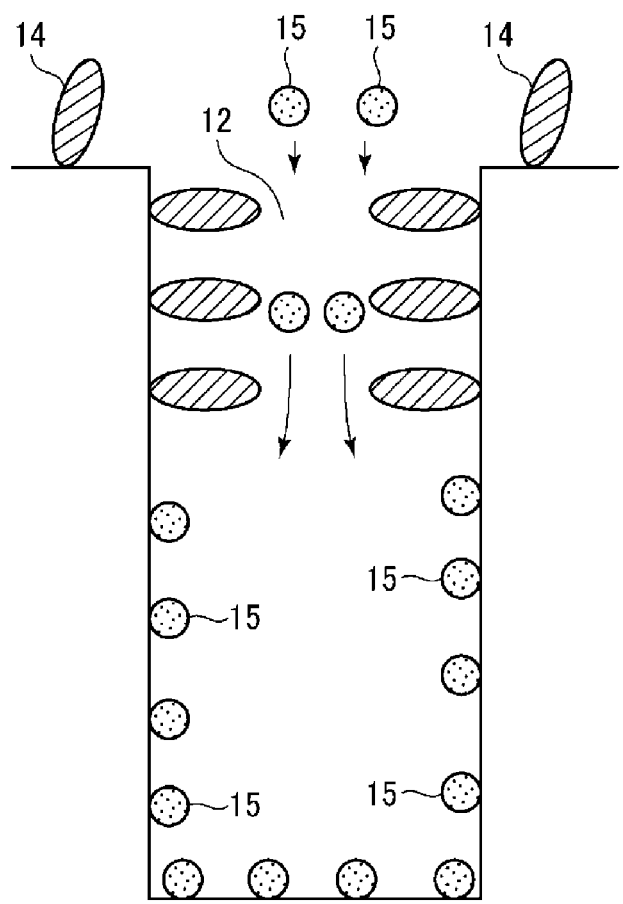
FIG. 5 is a diagram illustrating a mechanism of bottom-up growth of SiN using a polymer material.

By performing step S1 and step S2, the NH group is bonded to a dangling bond on an inner surface of the fine trench 12 and on a surface of a portion where the trench 12 is not present, and thereafter, by performing the supply of the polymer material (e.g., diglyme) of step 3, as illustrated in FIG. 5, the polymer material 14 is adsorbed to the NH group in an upper portion of the inner surface of the fine trench 12 and to the NH group present on the surface of the portion where the trench 12 is not present. At this time, since the opening of the fine trench 12 has been narrowed, it is difficult for the polymer material 14 having a large molecular size to reach a bottom portion of the fine trench 12. Accordingly, the polymer material 14 is hardly adsorbed to an NH group in the bottom portion of the fine trench 12. Thus, in the upper portion of the fine trench 12, adsorption of an Si precursor 15 to be subsequently supplied is hampered due to the presence of the polymer material 14, suppressing formation of an SiN film. However, in the bottom portion of the fine trench 12 to which the polymer material 14 is hardly adsorbed, adsorption of the Si precursor 15 to be subsequently supplied is not hampered and film formation of the SiN film is proceeded That is, the film formation is inhibited as only a small amount of the Si precursor is adsorbed in the upper portion of the fine trench 12, while the film formation proceeds by adsorbing the Si precursor in the bottom portion of the fine trench 12. Thus, it is possible to bottom-up grow SiN from the bottom portion of the fine trench 12. Accordingly, the V-shaped bottom-up SiN film 22 as illustrated in FIG. 3C is formed on the conformal SiN film 21 without blocking the opening of the fine trench 12.

Further, the first step may be omitted, and the second step of embedding may be performed from the initial stage of film formation depending on a shape of the fine trench 12.

Figure 3D:
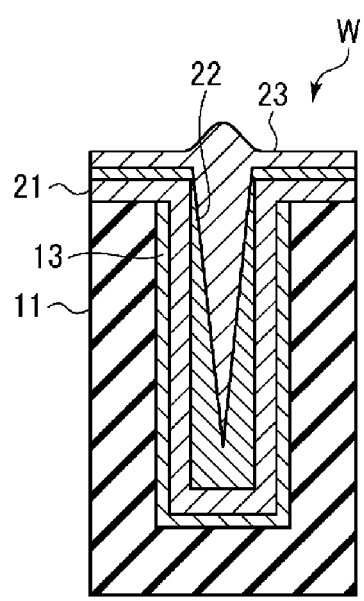

When the embedding by the bottom-up SiN film 22 has progressed to some extent in this way, the supply of the polymer material is stopped and the supply of the Si precursor and the nitriding are continued, whereby the conformal SiN film 23 is formed to fill a central V-shaped recess 22a left at the time of bottom-up film formation, and the embedding of the SiN film in the fine trench 12 is completed (FIG. 3D).

As described above, in the present embodiment, since SiN is grown from the bottom portion in the fine trench to perform bottom-up film formation, it is possible to embed the SiN film in the fine trench, without presence of seams or voids, which were difficult to achieve by the CVD method or a general ALD method.

<Film Forming Apparatus>

Next, examples of a film forming apparatus for carrying out the method of filling a recess according to the aforementioned embodiment will be described.

(First Example of the Film Forming Apparatus)

Figure 6:
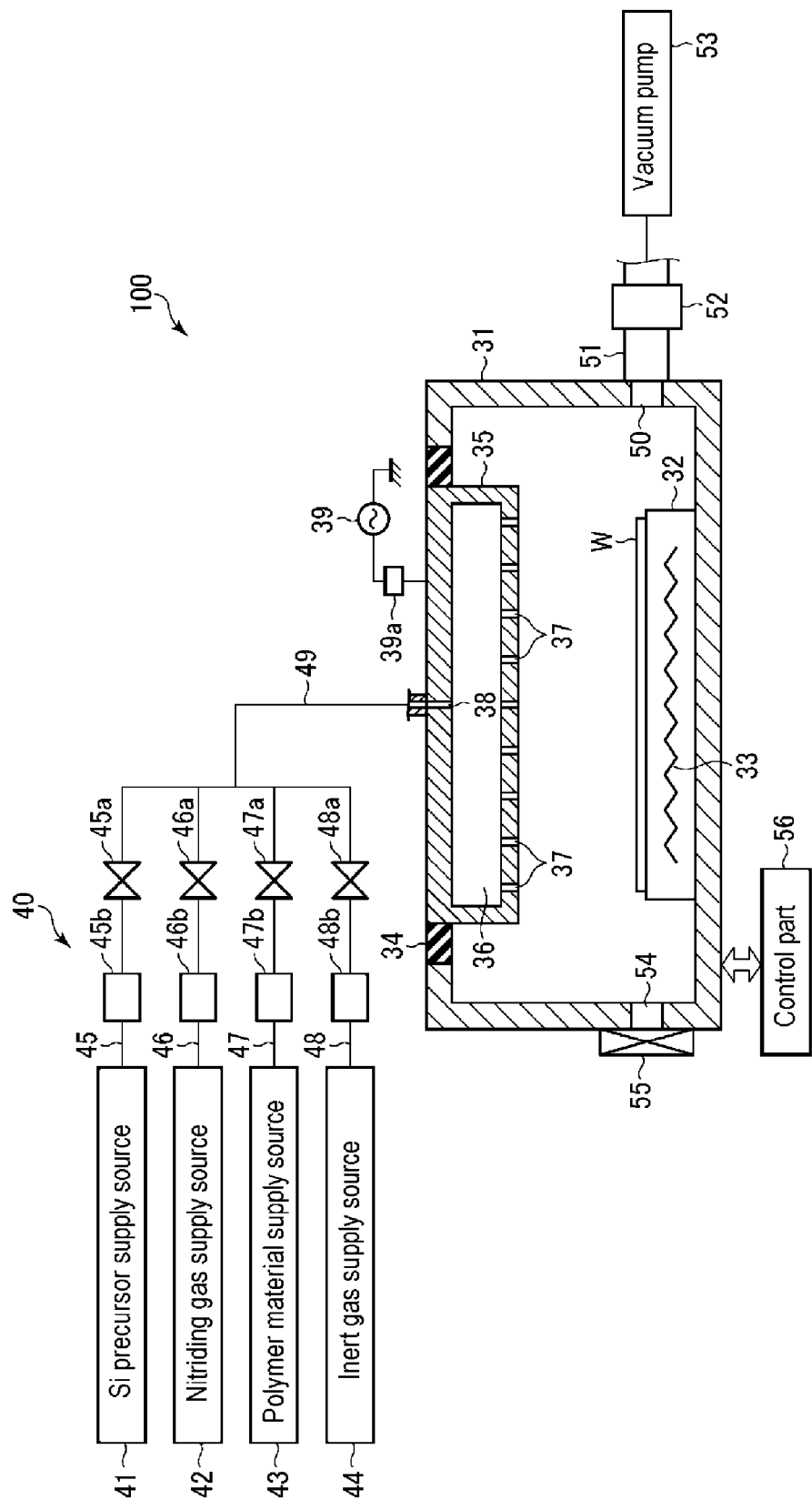
FIG. 6 is a horizontal sectional view schematically illustrating a first example of a film forming apparatus for carrying out the method of filling a recess according to one embodiment of the present disclosure.

FIG. 6 is a cross sectional view schematically illustrating a first example of a film forming apparatus for carrying out the method of filling a recess according to one embodiment of the present disclosure.

A film forming apparatus 100 of this example is configured as a single-wafer-type film forming apparatus for forming an SiN film by an ALD method, while generating plasma by forming a high-frequency electric field on parallel-plate electrodes.

This film forming apparatus 100 has a substantially cylindrical processing vessel 31. A wafer mounting table 32 on which the wafer W is mounted is installed in a bottom portion of the processing vessel 31. A heater 33 for heating the wafer W is installed in the wafer mounting table 32. The wafer mounting table 32 has a conductor portion and serves as a lower electrode of the parallel-plate electrodes.

A shower head 35 serving as an upper electrode of the parallel-plate electrodes via an insulating member 34 is installed on a ceiling wall of the processing vessel 31. A gas diffusion space 36 is formed inside the shower head 35, and a plurality of gas ejection holes 37 is formed on a lower surface of the shower head 35. A gas introduction hole 38 is formed at the center of the ceiling wall of the processing vessel 31, and a gas is introduced to the gas diffusion space 36 through the gas introduction hole 38 and ejected into the processing vessel 31 through the gas ejection hole 37.

A high-frequency power source 39 for generating plasma is connected to the shower head 35 via a matcher 39a. As a high-frequency power is supplied to the shower head 35 from the high-frequency power source 39, a high-frequency electric field is formed between the shower head 35 and a wafer mounting table 32, thus generating plasma in the processing vessel 31.

The film forming apparatus 100 has a gas supply mechanism 40 for supplying a gas to the shower head 35 through the gas introduction hole 38. The gas supply mechanism 40 has an Si precursor supply source 41 for supplying an Si precursor, for example, a DCS gas, a nitriding gas supply source 42 for supplying a nitriding gas, for example, an $NH_3$ gas, a polymer material supply source 43 for supplying a polymer material, for example, diglyme, and an inert gas supply source 44 for supplying an inert gas, for example, an Ar gas, and also has a first pipe 45, a second pipe 46, a third pipe 47, a fourth pipe 48, which are respectively connected to these supply sources, and a merge pipe 49 in which these pipes join. The merge pipe 49 is connected to the gas introduction hole 38 of the shower head 35.

An opening/closing valve 45a and a flow rate controller 45b such as a mass flow controller are installed in the first pipe 45, and an opening/closing valve 46a and a flow rate controller 46b are installed in the second pipe 46, an opening/closing valve 47a and a flow rate controller 47b are installed in the third pipe 47, and an opening/closing valve 48a and a flow rate controller 48b are installed in the fourth pipe 48.

An exhaust port 50 is installed in a lower portion of a sidewall of the processing vessel 31, and an exhaust pipe 51 is connected to the exhaust port 50. An automatic pressure control valve (APC) 52 for controlling an internal pressure of the processing vessel 31, and a vacuum pump 53 are connected to the exhaust pipe 51. Further, the interior of the processing vessel 31 is evacuated by the vacuum pump 53, and the internal pressure of the processing vessel 31 is regulated by adjusting a degree of opening of the APC 52 during the film forming process.

In addition, a loading/unloading port 54 for allowing the wafer W to be loaded into or unloaded from an adjacent vacuum transfer chamber (not shown) and a gate valve 55 for opening and closing the loading/unloading port 54 are installed on the opposite side of the exhaust port 50 in the sidewall of the processing vessel 31.

The film forming apparatus 100 further includes a control part 56. The control part 56 includes a main control part having a CPU for controlling the respective components of the film forming apparatus 100, for example, the valves, the mass flow controllers as the flow rate controllers, the heater power source, the high-frequency power source, and the like, an input device such as a keyboard, a mouse or the like, an output device, a display device, and a storage device. The main control part of the control part 56 causes the film forming apparatus 100 to execute a predetermined operation based on a process recipe retrieved from a storage medium by setting the storage medium in which the process recipe is stored in the storage device.

Next, an operation of forming an SiN film in a fine recess such as a fine trench or the like formed on a target substrate by the film forming apparatus 100 configured as described above will be described. The following processing operations are executed based on the process recipe stored in the storage medium of a storage part in the control part 56.

First, after the interior of the processing vessel 31 is adjusted to a predetermined pressure, the gate valve 55 is opened and the wafer W is transferred from an adjacent vacuum transfer chamber (not shown) via the loading/unloading port 54 by a transfer means (not shown) and placed on the wafer mounting table 32. The transfer means is withdrawn from the processing vessel 31 and the gate valve 55 is subsequently closed.

In this state, an inert gas, for example, an Ar gas, is supplied as a purge gas into the processing vessel 31 to adjust the interior of the processing vessel 31 to a pressure of about 0.1 to 5 Torr (13.3 to 667 Pa) by the APC 52, while performing exhaust by the vacuum pump 53, and the wafer W is controlled to have a predetermined temperature which falls within a range of 150 to 600 degrees C. by the heater 33.

In the case of forming the conformal SiN film of the first step as described above, the supply of an Si precursor, for example, a DCS gas, and the supply of a nitriding gas, for example, an $NH_3$ gas are repeated by operating the opening/closing valve 45a and the opening/closing valve 46a, while allowing an inert gas to flow, and a high-frequency power is applied from the high-frequency power source 39 in synchronization with the supply of the $NH_3$ gas. Accordingly, the conformal SiN film of the first step is formed in the fine recess by alternately repeating adsorption of the Si precursor and nitriding by nitriding species.

After the opening of the fine recess is narrowed to a predetermined width by the first step or when an initial width of the fine recess is narrow, the embedding of the second step of the present embodiment as described above is performed from the initial stage. At the second step, the supply of an Si precursor, for example, a DCS gas, the supply of a nitriding gas, for example, an $NH_3$ gas, and the supply of a polymer material, for example, diglyme, are repeatedly performed in this order by operating the opening/closing valve 45a, the opening/closing valve 46a, and the opening/closing valve 47a, while allowing an inert gas to flow, and at the same time, a high-frequency power is applied from the high-frequency power source 39 in synchronization with the supply of the $NH_3$ gas. Accordingly, the SiN film of the second step is formed by alternately and repeatedly performing adsorption of the Si precursor, nitriding by the nitriding species, and adsorption of the polymer material.

At this time, as mentioned above, the polymer material such as diglyme or the like is adsorbed to the upper portion of the recess with narrow width, and since its molecules are large, it is difficult for the polymer material to reach a bottom portion of the recess. Thus, the adsorption of the Si precursor to the upper portion of the recess is hampered and SiN may be bottom-up grown from the bottom portion of the recess to form an SiN film in a V shape. Accordingly, it is possible to fill the recess without blocking the opening of the recess, thereby preventing the presence of seams or voids in the recess.

Thereafter, the opening/closing valve 47a is closed to stop the supply of the polymer material, and a film is formed by adsorbing the Si precursor and performing nitriding by the nitriding species by the same operation as that of the first step to fill the V-shaped recess.

When the filling of the fine recess is completed, the internal pressure of the processing vessel 31 is regulated and the gate valve 55 is opened to allow the wafer W to be unloaded into the adjacent vacuum transfer chamber (not shown) via the loading/unloading port 54 by the transfer means (not shown).

(Second Example of the Film Forming Apparatus)

Figure 7:
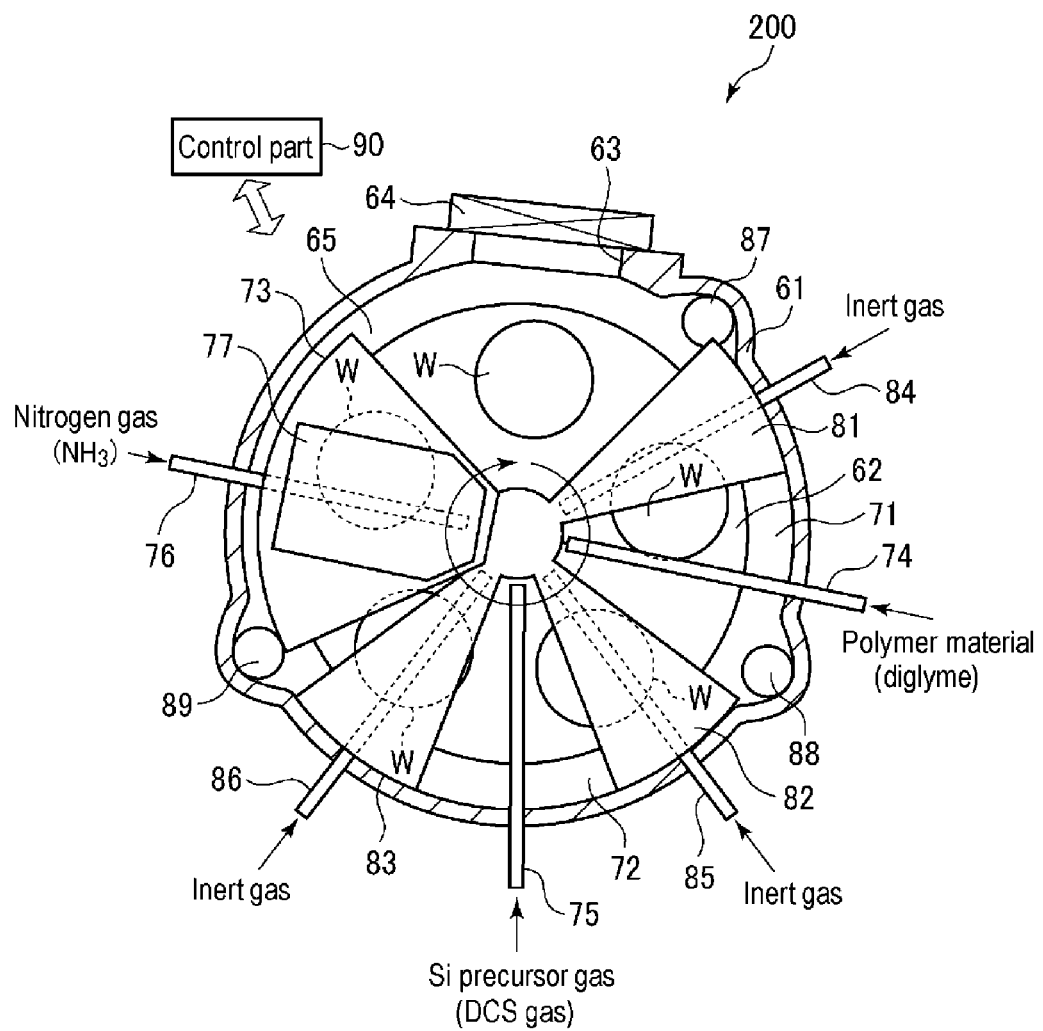
FIG. 7 is a horizontal sectional view schematically illustrating a second example of a film forming apparatus for carrying out the method of filling a recess according to one embodiment of the present disclosure.

FIG. 7 is a horizontal sectional view schematically illustrating a second example of a film forming apparatus for performing the method of filling a recess according to one embodiment of the present disclosure.

A film forming apparatus 200 of this example has a cylindrical processing vessel 61, and a turntable 62 for allowing a plurality of wafers W, for example, five wafers, to be mounted thereon is installed in the processing vessel 61. The turntable 62 is rotated in, for example, a clockwise direction.

A loading/unloading port 63 for allowing the wafer W to be loaded into and unloaded from the adjacent vacuum transfer chamber (not shown) is installed in a peripheral wall of the processing vessel 61, and the loading/unloading port 63 is configured to be opened and closed by a gate valve 64.

A portion corresponding to the loading/unloading port 63 in the processing vessel 61 is configured as a loading/unloading part 65, and the wafer W is loaded into the turntable 62 or unloaded from the turntable 62 in the loading/unloading part 65.

The interior of the processing vessel 61 is divided into six areas, excluding the loading/unloading part 65, along a rotation area of the turntable 62. That is, the interior of the processing vessel 61 is divided into a first processing area 71, a second processing area 72 and a third processing area 73 installed in a clockwise direction from the loading/unloading part 65, and a first separation area 81, a second separation area 82, and a third separation area 83 respectively installed between the loading/unloading part 65 and the first processing area 71, between the first processing area 71 and the second processing area 72, and between the second processing area 72 and the third processing area 73. Further, as the turntable 62 is rotated, the wafer W sequentially passes through these six areas. The first to third separation areas 81 to 83 have a function of separating gas atmospheres of the first to third processing areas 71 to 73.

A first process gas nozzle 74, a second process gas nozzle 75, and a third process gas nozzle 76 for ejecting a process gas into the wafer W on the turntable 62 are radially installed in the first processing area 71, the second processing area 72, and the third processing area 73 along a diameter direction of the processing vessel 61, respectively.

Further, a plasma generating mechanism 77 for converting a process gas ejected from the third process gas nozzle 76 into plasma is installed in the third processing area. The plasma generating mechanism 77 is installed to surround, for example, a space including a passage area of the wafer on the turntable 62, and has a housing formed as a high-frequency transmission member and a high-frequency antenna formed on the housing. As a high-frequency power is supplied to the high-frequency antenna, an inductively coupled plasma is generated in a space within the housing to convert the process gas supplied from the third process gas nozzle 76 into plasma.

In addition, a first inert gas nozzle 84, a second inert gas nozzle 85, and a third inert gas nozzle 86 for ejecting an inert gas to the wafer W on the turntable 62 are radially installed in the first separation area 81, the second separation area 82, and the third separation area along a diameter direction of the processing vessel 61, respectively. Further, as the inert gas is ejected from these nozzles, gas atmospheres are separated and the gas remaining in the wafer W is also removed.

Three exhaust ports 87, 88, and 89 are formed in the bottom portion of the processing vessel 61. The interior of the processing vessel 61 is evacuated through these exhaust ports 87, 88, and 89.

In the film forming apparatus 200, a gaseous polymer material, for example, diglyme, is supplied from the first process gas nozzle 74, an Si precursor, for example, a DCS gas, is supplied from the second process gas nozzle 75, and a nitriding gas, for example, an $NH_3$ gas, is supplied from the third process gas nozzle 76. Thus, the first processing area 71 becomes a polymer material supply area, the second processing area 72 becomes an Si precursor supply area, and the third processing area 73 becomes a nitriding area.

The film forming apparatus 200 has a control part 90. The control part 90 is configured similarly to the control part 56 of the film forming apparatus 100 of the first example.

Further, in FIG. 7, a polymer material supply source, an Si precursor supply source, a nitriding gas supply source, an inert gas supply source, and pipes, flow rate controllers, opening/closing valves, and the like, which are connected to these supply sources, are omitted, but these components are also installed in the same manner as those of the film forming apparatus 100. In addition, a heating device is installed in the turntable 62. Furthermore, an exhaust pipe is connected to the exhaust ports 87, 88, and 89, and an exhaust mechanism having a pressure regulation valve and a vacuum pump is installed in the exhaust pipe.

Next, an operation of forming an SiN film in a fine recess such as a fine trench or the like formed on a target substrate by the film forming apparatus 200 configured as described above will be described. The following processing operations are executed based on a process recipe stored in a storage medium of a storage part in the control part 90.

First, after the interior of the processing vessel 31 is adjusted to a predetermined pressure, the gate valve 64 is opened and a plurality of wafers W, for example, five wafers, are sequentially transferred from an adjacent vacuum transfer chamber (not shown) via the loading/unloading port 63 by a transfer means (not shown) and mounted on the wafer mounting table 32. Then, the internal pressure of the processing vessel 61 is regulated to a pressure of about 0.1 to 5 Torr (13 to 667 Pa) by the exhaust mechanism. Thereafter, the turntable 62 is heated by the heating device (not shown) and the wafer W is heated to a predetermined temperature which falls within a range of 150 to 600 degrees C. via the turntable 62.

In the case of forming the conformal SiN film of the first step as described above, a polymer material is not supplied from the first process gas nozzle 74, and an Si precursor, for example, a DCS gas, is ejected from the second process gas nozzle 75 and a nitriding gas, for example, an $NH_3$ gas, is ejected from the third process gas nozzle 76 so that they are converted into plasma by the plasma generating mechanism 77 to generate nitriding species. Then, in a state in which an inert gas is ejected from the first to third inert gas nozzles 84 to 86, the turntable 62 is rotated. Accordingly, the Si precursor, the inert gas, the nitriding species, and the inert gas are sequentially supplied to the wafer W so that the conformal SiN film of the first step is formed in the fine recess by the film forming method based on the ALD method.

After the opening of the fine recess is narrowed to a predetermined width by the first step or when an initial width of the fine recess is narrow, the second step of the embedding of the present embodiment as described above is performed from the initial step. At the second step, a polymer material, for example, diglyme, is ejected from the first process gas nozzle 74, an Si precursor, for example, a DCS gas, is ejected from the second process gas nozzle 75, and a nitriding gas, for example, an $NH_3$ gas, is ejected from the third process gas nozzle 76 so that they are converted into plasma by the plasma generating mechanism 77 to generate nitriding species. Then, in a state in which an inert gas is ejected from the first to third inert gas nozzles 84 to 86, the turntable 62 is rotated. Accordingly, the polymer material, the inert gas, the Si precursor, the inert gas, the nitriding species, and the inert gas are sequentially supplied to the wafer W having an NH group on its surface so that adsorption of the Si precursor, nitriding by the nitriding species, and adsorption of the polymer material are alternately and repeatedly performed on the wafer W to form the SiN film of the second step.

At this time, as mentioned above, the polymer material such as diglyme or the like is adsorbed to the upper portion of the recess with narrow width, and since its molecules are large, it is difficult to reach a bottom portion of the recess. Thus, the adsorption of the Si precursor to the upper portion of the recess is hampered and SiN can be bottom-up grown from the bottom portion of the recess to form the SiN film in a V shape. Accordingly, it is possible to fill the recess without blocking the opening of the recess, thereby preventing the presence of seams or voids in the recess.

Thereafter, the supply of the polymer material is stopped, and a film is formed by adsorbing the Si precursor and performing nitriding by the nitriding species through the same operation as that of the first step to fill a V-shaped recess.

When the filling of the fine recess is completed, the internal pressure of the processing vessel 61 is regulated and the gate valve 64 is opened to allow the wafer W to be unloaded into the adjacent vacuum transfer chamber (not shown) via the loading/unloading port 63 by the transfer means (not shown).

<Other Applications>

While the embodiment of the present disclosure has been described above, the present disclosure is not limited to the aforementioned embodiment but may be differently modified without departing from the spirit of the present disclosure.

For example, in the aforementioned embodiment, there has been described a case where a silicon nitride film is formed using the Si precursor, the nitriding species, and the polymer material as an example, but the present disclosure is not limited thereto. For example, the present disclosure may be applied to a case where a TiN film is formed using a Ti precursor such as a $TiCl_4$ gas, nitriding species, and a polymer material, or a case where a BN film is formed using a B precursor such as a $BCl_3$ gas, nitriding species, and a polymer material, a case where a WN film is formed using a W precursor such as a $WCl_6$ gas, nitriding species, and a polymer material, a case of embedding other nitride films, and so on.

Further, the film forming apparatus is not limited to the exemplified ones, and other various film forming apparatuses may be used.

According to the present disclosure in some embodiments, since at least a portion of the period for forming a nitride film is used as a bottom-up growth period for which a polymer material adsorbable to a surface of a target substrate is supplied in a gaseous state to allow the polymer material to be adsorbed to an upper portion of the recess, and the nitride film is caused to be grown from the bottom portion of the recess by inhibiting adsorption of the film-forming raw material gas, it is possible to fill the nitride film in the fine recess without generation of voids or seams.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of filling a recess by forming a nitride film in the recess by repeating a cycle, the cycle comprising:
    a film-forming raw material gas adsorption process of adsorbing a film-forming raw material gas containing an element forming the nitride film to be formed on a target substrate on which the recess is formed on a surface of the target substrate; and
    a nitriding process of nitriding the adsorbed film-forming raw material gas by nitriding species generated by activating a nitriding gas to fill the recess,
    wherein at least a portion of a period for forming the nitride film is used as a bottom-up growth period, for which a polymer material adsorbable to the surface of the target substrate is supplied in a gaseous state and is adsorbed to an upper portion of the recess to inhibit adsorption of the film-forming raw material gas, and for which the nitride film is grown from a bottom portion of the recess.

2. The method of claim 1, wherein a first period for forming the nitride film is used as a conformal nitride film forming period for which a conformal nitride film is formed by repeating the film-forming raw material gas adsorption process and the nitriding process without supplying the polymer material, and a subsequent period is set as the bottom-up growth period.

3. The method of claim 1, wherein, during the bottom-up growth period, the film-forming raw material gas adsorption process, the nitriding process, and a polymer material adsorption process of adsorbing the polymer material to the upper portion of the recess are repeated in this order.

4. A method of filling a recess by forming a nitride film in the recess formed on a surface of a target substrate, the method comprising:
    a first process of forming a conformal nitride film in the recess by repeating a film-forming raw material gas adsorption process of adsorbing a film-forming raw material gas containing an element forming the nitride film to be formed, and a nitriding process of nitriding the adsorbed film-forming raw material gas by nitriding species generated by activating a nitriding gas; and
    a second process of inhibiting adsorption of the film-forming raw material gas and growing the nitride film from a bottom portion of the recess by repeating the film-forming raw material gas adsorption process, the nitriding process, and a polymer material adsorption process of supplying a polymer material adsorbable to the surface of the target substrate in a gaseous state to allow the polymer material to be adsorbed to an upper portion of the recess in this order.

5. The method of claim 4, further comprising a third process of forming a conformal nitride film by repeating the film-forming raw material gas adsorption process and the nitriding process after the second process.

6. The method of claim 1, wherein the polymer material is adsorbed to an NH group formed on the surface of the target substrate by the nitriding process.

7. The method of claim 6, wherein the polymer material is a polymer material having an ether bond.

8. The method of claim 7, wherein the polymer material having an ether bond is at least one selected from a group consisting of glyme, diglyme, and triglyme.

9. The method of claim 1, wherein the film-forming raw material gas contains Si and the nitride film is a silicon nitride film.

10. The method of claim 9, wherein the film-forming raw material gas is at least one selected from a group consisting of dichlorosilane, monochlorosilane, trichlorosilane, silicon tetrachloride, and hexachlorodisilane.

11. The method of claim 1, wherein an $NH_3$ gas is used as the nitriding gas.

* * * * *